(12) United States Patent
Chen

(10) Patent No.: US 10,286,595 B2
(45) Date of Patent: May 14, 2019

(54) OBJECT STAGE AND HOT PRESSING APPARATUS

(71) Applicant: BOE TECHNOLOGY GROUP CO., LTD., Beijing (CN)

(72) Inventor: Lei Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 127 days.

(21) Appl. No.: 15/320,027

(22) PCT Filed: Jan. 13, 2015

(86) PCT No.: PCT/CN2015/070627
§ 371 (c)(1),
(2) Date: Dec. 19, 2016

(87) PCT Pub. No.: WO2016/026267
PCT Pub. Date: Feb. 25, 2016

(65) Prior Publication Data
US 2017/0252961 A1 Sep. 7, 2017

(30) Foreign Application Priority Data
Aug. 20, 2014 (CN) .................... 2014 2 0471893 U

(51) Int. Cl.
*B29C 33/32* (2006.01)
*B29C 43/32* (2006.01)
(Continued)

(52) U.S. Cl.
CPC .......... *B29C 51/261* (2013.01); *B25B 11/002* (2013.01); *B25B 11/005* (2013.01);
(Continued)

(58) Field of Classification Search
CPC ....... B29C 59/00; B29C 59/002; B29C 59/02; B29C 2791/006; B29C 43/32; B29C 2043/3605; B29C 33/32
(Continued)

(56) References Cited

U.S. PATENT DOCUMENTS 5,470,590 A * 11/1995 Brubaker ............ B29C 44/1204
425/3
5,513,972 A * 5/1996 Schroeder ............... B29C 33/04
425/175
(Continued)

FOREIGN PATENT DOCUMENTS

CN 2377071 Y 5/2000
CN 1462067 A 12/2003
(Continued)

OTHER PUBLICATIONS

Search Report and Written Opinion dated May 28, 2015 from State Intellectual Property Office of the P.R. China.

*Primary Examiner* — Joseph S Del Sole
*Assistant Examiner* — Thu Khanh T Nguyen
(74) *Attorney, Agent, or Firm* — Dilworth & Barrese, LLP.; Michael J. Musella, Esq.

(57) ABSTRACT

An object stage and a hot pressing apparatus are disclosed. The object stage includes a base (1) and a support device (2) fixed on the base (1), wherein the support device (2) includes a plurality of detachable support sub-devices (21); the support device is configured to allow a printed circuit board (3) with at least one protruding structure (4) to be placed thereon, and no support sub-device (21) is disposed at a position on the support device (2) corresponding to the protruding structure (1). The object stage reduces manufacture cost, saves production time and improves production efficiency.

15 Claims, 4 Drawing Sheets

(51) Int. Cl.
  *B29C 51/26* (2006.01)
  *B30B 15/06* (2006.01)
  *H05K 3/00* (2006.01)
  *B25B 11/00* (2006.01)
  *B29L 31/34* (2006.01)
  *H05K 3/32* (2006.01)

(52) U.S. Cl.
  CPC .......... *B30B 15/062* (2013.01); *B30B 15/065* (2013.01); *H05K 3/007* (2013.01); *B29L 2031/3425* (2013.01); *B30B 15/064* (2013.01); *H05K 3/323* (2013.01); *H05K 2203/0113* (2013.01); *H05K 2203/0165* (2013.01); *H05K 2203/0278* (2013.01); *H05K 2203/068* (2013.01); *H05K 2203/085* (2013.01)

(58) Field of Classification Search
  USPC .......................................................... 425/407
  See application file for complete search history.

(56) References Cited

U.S. PATENT DOCUMENTS

| | | | |
|---|---|---|---|
| 6,578,399 B1 * | 6/2003 | Haas | B21D 22/10 |
| | | | 72/342.1 |
| 7,159,836 B2 * | 1/2007 | Parks | B29C 43/36 |
| | | | 425/407 |
| 8,206,637 B2 * | 6/2012 | Dietrich | B29C 64/386 |
| | | | 425/375 |
| 2001/0010190 A1 | 8/2001 | Urano | |

FOREIGN PATENT DOCUMENTS

| | | |
|---|---|---|
| CN | 1681169 A | 12/2005 |
| CN | 102194721 A | 9/2011 |
| CN | 103415158 A | 11/2013 |
| CN | 204031604 U | 12/2014 |

* cited by examiner

OBJECT STAGE AND HOT PRESSING APPARATUS

Embodiments of the present invention relate to an object stage and a hot pressing apparatus.

BACKGROUND

During manufacture of a PCB (Printed Circuit Board), it is necessary to hot-press an anisotropic conductive film (ACF) onto a finished PCB, which requires to steadily place the PCB onto an object stage; otherwise, effects of hot pressing may be affected.

Considering the finished PCB generally has electronic elements disposed on both its sides, it needs to form recesses at positions on the object stage corresponding to the electronic elements, so that the electronic elements will be located in these recesses respectively during the PCB is being placed onto the object stage, which ensures a steady placement. Since the specific number and positions of the electronic elements are not exactly the same for different PCBs, the object stage has to be designed and manufactured depending on the type of the PCB so as to satisfy different demands. During manufacturing, every time when a PCB is replaced by another one of different type, the current object stage mounted at the hot pressing apparatus has to be replaced by another one matched with the new PCB.

In summary, the technical solution described above involves the following technical problems. On one aspect, each type of PCB corresponds to one object stage, thus the used object stage cannot be recycled but only be discarded upon the hot pressing process by using ACF is completed, which leads to increased manufacturing costs. On the other aspect, during manufacturing, every time when a PCB is replaced by another one of different type, the original object stage has to be replaced by a matched one, which will take a relatively long time and result in waste of production time and poor production efficiency.

SUMMARY

At least one embodiment of the present invention provides an object stage and a hot pressing apparatus, which can reduce manufacture cost, save production time and improve production efficiency.

The object stage as provided by at least one embodiment of the present invention includes a base and a support device fixed on the base, the support device is configured to allow a printed circuit board (PCB) with at least one protruding structure to be placed thereon; wherein the support device includes a plurality of detachable support sub-devices, and no support sub-device is disposed at a position on the support device corresponding to the protruding structure.

In an example, the base is provided with location holes while each of the support sub-devices is provided with a location structure cooperated with one of the location holes in a manner of engaging the location structure into the location hole to fix the support sub-devices on the base; or the base is provided with location structures while each of the support sub-devices is provided with a location hole cooperated with one of the location structures in a manner of engaging the location structure into the location hole to fix the support sub-devices on the base.

In an example, the location structure is clipped into the location hole.

In an example, the base is provided with an electromagnetic coil on its external surface; the electromagnetic coil is configured to provide the base and the support sub-device with opposite magnetic properties when powered on, so that the base and the support sub-devices are attracted with each other; and the electromagnetic coil is further configured to demagnetize both of the base and the support sub-devices when powered off, so that the base and the support sub-devices are no longer attracted with each other.

In an example, a rim is further disposed at an edge of the base and configured to block the support sub-devices so as to prevent the support sub-devices from falling off the base.

In an example, a height of the rim is less than that of the support sub-device.

In an example, the base is provided with first vacuum holes, the support sub-devices are provided with second vacuum holes, and the first vacuum holes are disposed opposite to the second vacuum holes respectively; and the first vacuum holes and the second vacuum holes form vacuum air paths which are configured to absorb the PCB under a vacuum state.

In an example, the first vacuum holes and the second vacuum holes are evenly distributed.

In an example, orthographic projections of the second vacuum holes on the base are exactly consistent with the first vacuum holes, respectively.

In an example, an area of an orthographic projection of the support device on the base is less than or equal to an area of a supporting surface of the base.

The hot pressing apparatus as provided by at least one embodiment of the present invention includes any of the above-mentioned object stage.

BRIEF DESCRIPTION OF THE DRAWINGS

Hereafter, the embodiments of the present invention will be described in a more detailed way with reference to the accompanying drawings, so as to make one person skilled in the art be able to understand the present invention more clearly, wherein:

FIG. 3B is a structure view illustrating a support sub-device of the object stage in FIG. 3a;

DETAILED DESCRIPTION

The technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
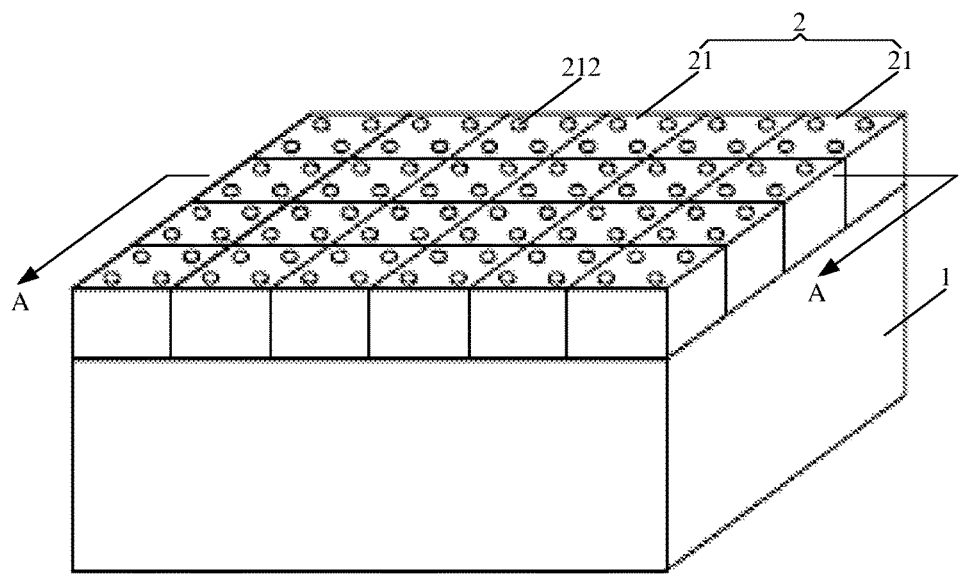
FIG. 1 is a structural view illustrating an object stage provided in a first embodiment of the present invention.

FIG. 1 is a structural view illustrating an object stage provided in a first embodiment of the present invention. As illustrated in FIG. 1, the object stage includes a base 1 and a support device 2 fixed on the base 1. The support device 2 includes a plurality of detachable support sub-devices 21. The support device 2 is configured to allow a printed circuit board (PCB) with at least one protruding structure (not illustrated in FIG. 1) to be placed thereon, wherein no support sub-device 21 is disposed at a position on the support device 2 corresponding to the protruding structure.

For example, the protruding structure may be an electronic element on the PCB.

In the present embodiment, the support device 2 is disposed on a supporting surface of the base 1, so that an area of an orthographic projection of the support device 2 on the base 1 is equal to an area of the supporting surface of the base 1. In this way, the orthographic projection of the support device 2 on the base 1 is exactly consistent with the supporting surface of the base 1. Of course, it's easily conceivable that in other embodiments the area of the orthographic projection of the support device on the base may be less than the area of the supporting surface of the base, which will not be described herein in details.

In the present embodiment, the support sub-device 21 may be formed as a block.

Figure 2:
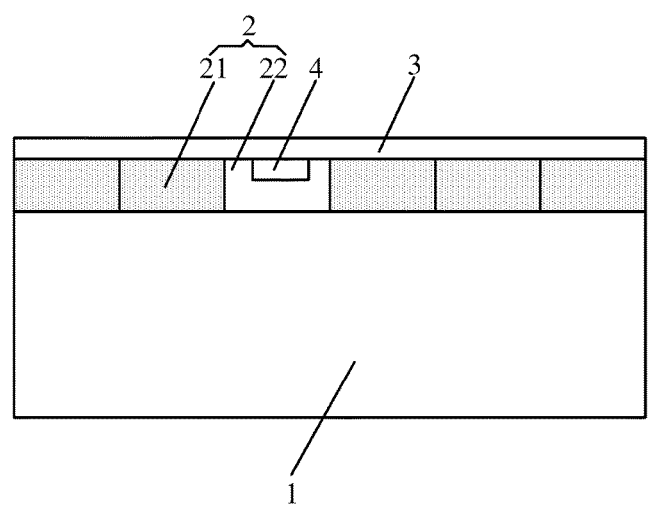
FIG. 2 is a schematic view illustrating a printed circuit board being placed on a support device in the first embodiment of the present invention.

FIG. 2 is a schematic view illustrating a PCB being placed onto a support device in the first embodiment of the present invention. As illustrated in FIG. 2, the PCB 3 has protruding structures 4 on both its sides, for example, one or more protruding structures may be disposed, and the positions of the protruding structures on the PCB 3 may be configured according to design requirements of the PCB 3. The number and positions of the protruding structures 4 may be varied depending on the type of the PCB. FIG. 2 only illustrates the case where the protruding structure 4 is disposed on one side adjacent to the support device 2 and the description is given with reference to the case where only one protruding structure 4 is disposed. When the PCB 3 is to be placed onto the support device 2, at first, the support sub-device 21, if it has been mounted, disposed at the position corresponding to the protruding structure 4 has to be removed from the base 1; or the position on the support device corresponding to the protruding structure 4 has to be reserved as empty space during mounting the sub-device 21, so that no support sub-device 21 occupies the position corresponding to the protruding structure 4; then the PCB 3 may be placed onto the support device 2. At this point, the protruding structure 4 of the PCB 3 will be located in the empty space on the base 1 with no support sub-device 21 disposed therein, and the portions of the PCB 3 that are not provided with the protruding structure 4 will be closely contacted with the support sub-devices 21, so that the PCB 3 can be placed onto the object stage steadily.

Figure 3A:
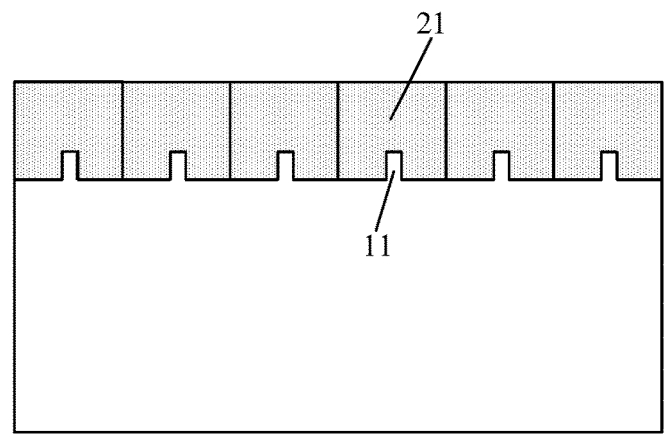
FIG. 3A is a sectional view illustrating the object stage in FIG. 1 taken along A-A direction.
Figure 3B:
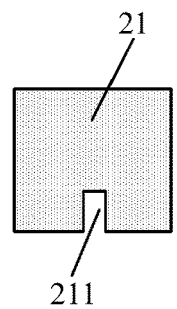
Figure 3C:
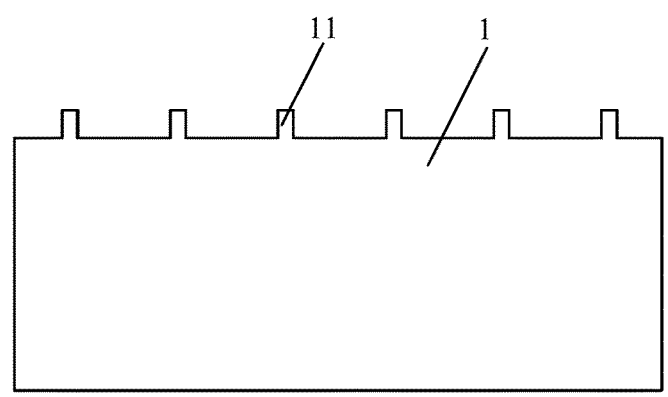
FIG. 3C is a structure view illustrating a base of the object stage in FIG. 1.

FIG. 3A is a sectional view illustrating the object stage in FIG. 1 taken along A-A direction, FIG. 3B is a structure view illustrating a support sub-device of the object stage in FIG. 3A, and FIG. 3C is a structure view illustrating a base of the object stage in FIG. 1.

As illustrated in FIGS. 3A-3C, the base 1 is provided with location structures 11, and each of the support sub-devices 21 is provided with a location hole 211 operated with one of the location structures 11. For example, the location structure 11 is engaged (e.g. clipped) into the corresponding location hole 211 to fix the support sub-device 21 onto the base 1. Removing a support sub-device 21 from the base 1 can be achieved by directly pulling the support sub-device 21 out of the base 1. Therefore, the solution of fixing the support sub-devices 21 onto the base 1 by using location structures 11 and location holes 211 is simple and easy to implement. In one example, the location structures 11 may be formed integrally with the base 1 through molding. In a different example, each support sub-device 21 may be provided with one or more location holes 211. The present embodiment is described with reference to the case where each support sub-device 21 is provided with one location hole 211. In the present embodiment, the location structure 11 may be a location post.

In a variation of the present embodiment, the base 1 may be provided with location holes 211 while each of the support sub-devices 21 may be provided with a location structure 11 cooperated with one of the location holes 211, so that the location structure 11 can be engaged into the location hole 211 to fix the support sub-devices 21 onto the base 1. Such variation shares the same principle with the solution illustrated in FIG. 3A, thus will not be described in details.

Figure 4:
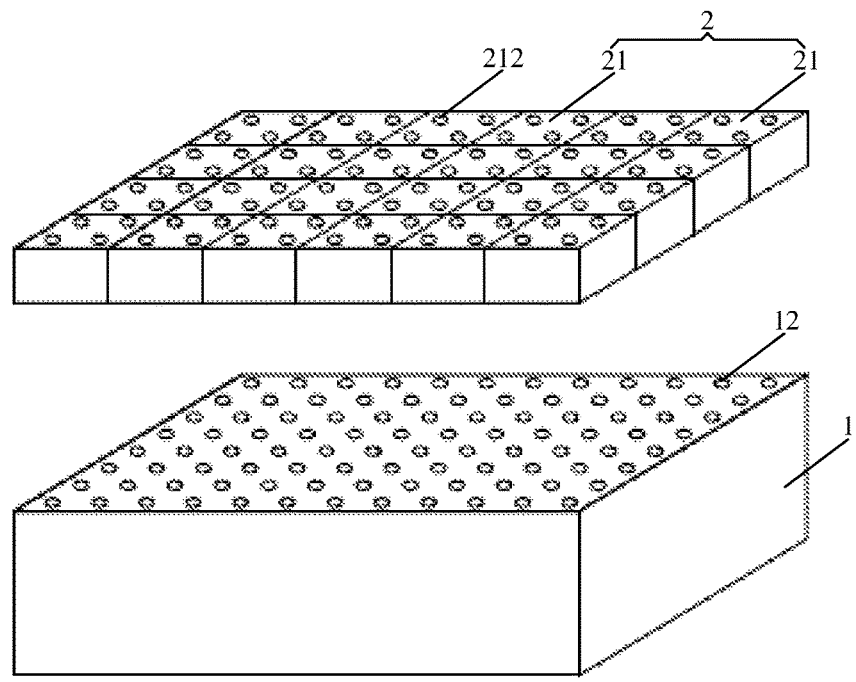
FIG. 4 is a schematic view illustrating assembling of the object stage in FIG. 1.

FIG. 4 is a schematic view illustrating assembling of the object stage in FIG. 1. As illustrated in FIG. 1 and FIG. 4, the base 1 is provided with first vacuum holes 12 and the support sub-devices 21 are provided with second vacuum holes 212 which are disposed opposite to the second vacuum holes 212 respectively. The first vacuum holes 12 and the second vacuum holes 212, together, form vacuum air paths which are operable, under vacuum state, to absorb and hence fix the PCB onto the support device 2. In one example, the first vacuum holes 12 and the second vacuum holes 212 are evenly distributed. In order to ensure a clear passage through the vacuum air paths, orthographic projections of the second vacuum holes 212 on the base are exactly consistent with the first vacuum holes 21, respectively.

The object stage provided in the first embodiment of the present invention includes a base and a support device, the support device allows a PCB to be placed thereon. The support device includes a plurality of detachable support sub-devices, but has no support sub-device disposed at a position on the support device corresponding to a protruding structure of the PCB. In the present embodiment, the support sub-device corresponding to the protruding structure may be removed from the support device according to the type of the PCB, so that the object stage may be used for different types of PCBs and hence can be used repeatedly so as to save manufacture costs; the object stage can accommodate different types of PCBs only by rearranging the support sub-devices, which avoids the case where the object stage has to be replaced every time when a different type of PCB is to be placed, so as to save the time for replacing the object stage, reduce the production time and improve the production efficiency.

Figure 5:
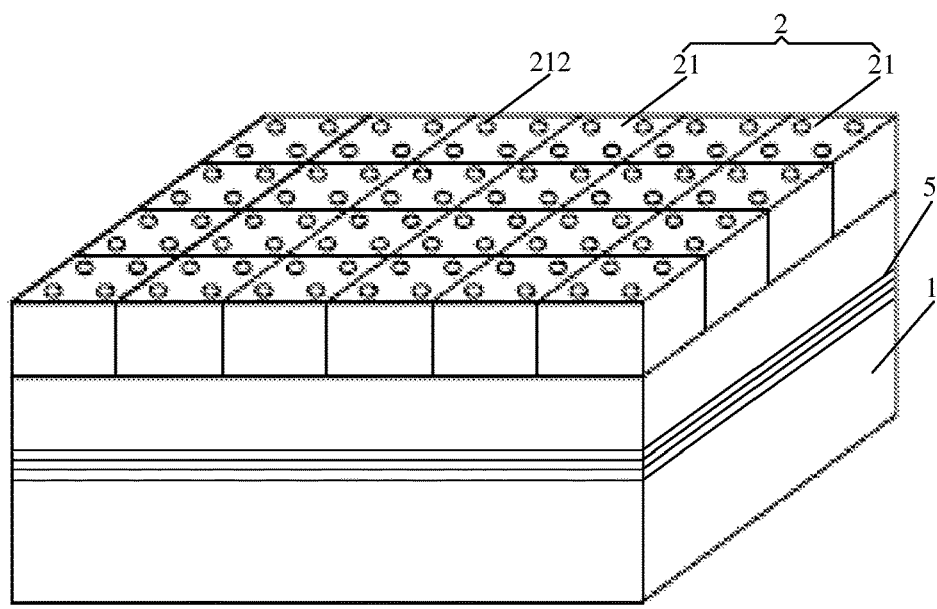
FIG. 5 is a structure view illustrating an object stage provided in a second embodiment of the present invention.

FIG. 5 is a structure view illustrating an object stage provided in a second embodiment of the present invention. As illustrated in FIG. 5, the difference between the object stages provided in the present embodiment and the first embodiment described above lies in that the base 1 is provided with an electromagnetic coil 5 on its outer surface. The electromagnetic coil 5 is configured to provide the support sub-device 21 and the base 1 with opposite magnetic properties when it's powered on, so that the base 1 and the support sub-device 21 can be attracted with each other; moreover, the electromagnetic coil 5 is configured to demagnetize both of the base 1 and the support sub-device 21 when it's powered off, so that the base 1 and the support sub-device 21 are no longer attracted with each other.

For example, when the support sub-device 21 is to be fixed on the base 1, the electromagnetic coil 5 is powered on to provide the base 1 and the support sub-device 21 with opposite magnetic properties. Then the base 1 and the support sub-device 21 are attracted each other to fix the support sub-device 21 onto the base 1.

For example, when the support sub-device 21 is to be detached from the base 1, the electromagnetic coil 5 is powered off to demagnetize both of the base 1 and the support sub-device 21. Then the base 1 and the support sub-devices 21 are no longer attracted with each other, so that the support sub-device 21 may be detached from the base 1.

In the present embodiment, to ensure immediate demagnetization of the base 1 and the support sub-devices 21 upon the electromagnetic coil 5 is powered off, the materials of the base 1 and the support sub-device 21 can both be soft magnetic material.

As for other structures of the object stage provided in the second embodiment, reference may be made to the description given in the first embodiment without repeating herein.

In the second embodiment of the present invention, the support sub-device is fixed onto and detached from the base through the electromagnetic coil, which is a solution simple and easy to implement.

Figure 6:
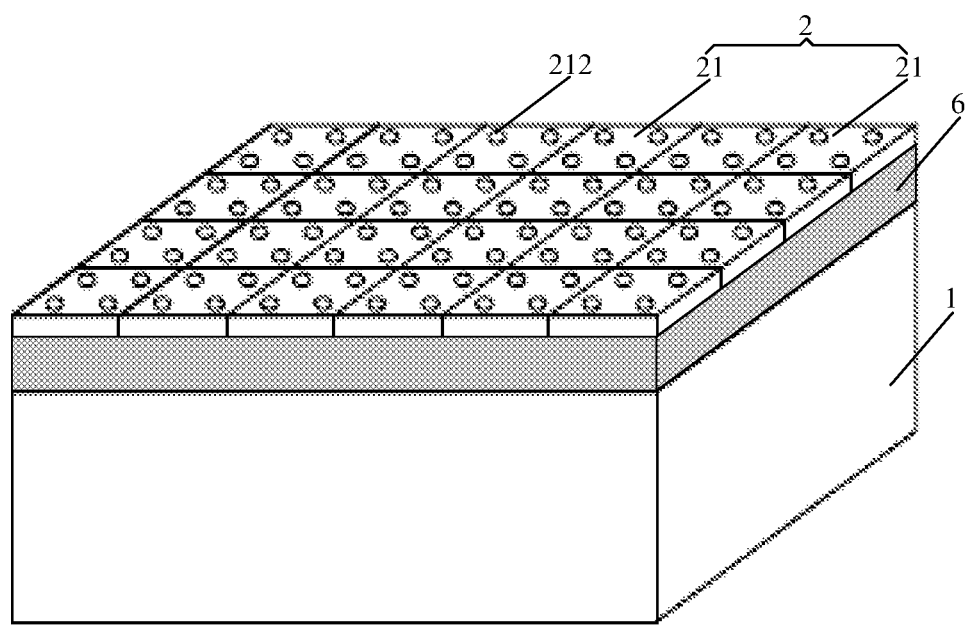
FIG. 6 is a structure view illustrating an object stage provided in a third embodiment of the present invention.

FIG. 6 is a structure view illustrating an object stage provided in a third embodiment of the present invention. As illustrated in FIG. 6, in the present embodiment, based on the first embodiment described above, a rim 6 is further disposed at an edge of the base 1 to block the support sub-device 21 on the edge so as to prevent the same from falling off the base 1.

In the present embodiment, a height of the rim 6 is less than that of the support sub-device 21. In a variation of the present embodiment, the height of the rim 6 may be equal to that of the support sub-device 21.

As for other structures of the object stage provided in the third embodiment, reference may be made to the description given in the first embodiment without repeating herein.

In one example, the rim provided in the third embodiment may also be applied in the object stage provided in the second embodiment without repeating herein.

The rim disposed in the object stage provided in the third embodiment can effectively prevent the support sub-device from falling off the base when a support sub-device 21 is being placed onto or taken from the base.

The object stages provided in various embodiments described in the present disclosure are not mutually exclusive but can be combined, at their features, with each other so as to attain new embodiments.

An embodiment of the present invention further provides a hot pressing apparatus including the object stage provided in any of the first, second and third embodiments described above. As for the detailed description of the hot pressing apparatus, reference may be made to the foregoing embodiments without repeating herein.

In the hot pressing apparatus provided in the present embodiment, the object stage includes a base and a support device which allows a PCB to be mounted thereon, the support device includes a plurality of detachable support sub-devices, and no support sub-device is disposed at a position corresponding to a protruding structures of the PCB; in this way, the hot pressing apparatus provided in the present embodiment enables an object stage to be adapted to different types of PCBs and hence be reusable by removing the support sub-device corresponding to the protruding structure of the PCT from the support device according to the type of the PCB, so as to save the manufacture costs; the object stage of the hot pressing apparatus provided in the present embodiment can accommodate different types of PCBs only by rearranging the support sub-devices, which avoids the case where the object stage has to be replaced every time when a different type of PCB is to be placed, so as to save the time for replacing the object stage, reduce the production time and improve the production efficiency.

The present disclosure claims the benefits of Chinese patent application No. 201420471893.3, which was filed with the SIPO on Aug. 20, 2014 under the title of "OBJECT STAGE AND HOT PRESSING APPARATUS" and is fully incorporated herein by reference as part of this application.

The invention claimed is:

1. An object stage, comprising a base and a support device fixed on the base, wherein
   the support device comprises a plurality of detachable support sub-devices; and
   the support device is configured to allow a printed circuit board (PCB) with at least one protruding structure to be placed thereon, and no support sub-device is disposed at a position on the support device corresponding to the protruding structure,
   wherein the base is provided with an electromagnetic coil on its external surface,
   wherein the electromagnetic coil is configured to provide the base and the support sub-device with opposite magnetic properties when powered on, so that the base and the support sub-devices are attracted with each other, and
   wherein the electromagnetic coil is further configured to demagnetize both of the base and the support sub-devices when powered off, so that the base and the support sub-devices are no longer attracted with each other.

2. The object stage of claim 1, wherein
   the base is provided with location holes while each of the support sub-devices is provided with a location structure cooperated with one of the location holes in a manner of engaging the location structure into the location hole to fix the support sub-devices onto the base; or
   the base is provided with location structures while each of the support sub-devices is provided with a location hole cooperated with one of the location structures in a manner of engaging the location structure into the location hole to fix the support sub-devices on the base.

3. The object stage of claim 2, wherein the location structure is clipped into the location hole.

4. The object stage of claim 1, wherein a rim is further disposed at an edge of the base and configured to block the support sub-devices so as to prevent the support sub-devices from falling off the base.

5. The object stage of claim 4, wherein a height of the rim is less than that of the support sub-device.

6. The object stage of claim 1, wherein the base is provided with first vacuum holes, the support sub-devices are provided with second vacuum holes, and the first vacuum holes are disposed opposite to the second vacuum holes respectively; and the first vacuum holes and the second vacuum holes form vacuum air paths which are configured to absorb the PCB under a vacuum state.

7. The object stage of claim 6, wherein the first vacuum holes and the second vacuum holes are evenly distributed.

8. The object stage of claim 6, wherein orthographic projections of the second vacuum holes on the base are exactly consistent with the first vacuum holes, respectively.

9. The object stage of claim 1, wherein an area of an orthographic projection of the support device on the base is less than or equal to an area of a supporting surface of the base.

10. A hot pressing apparatus, comprising an object stage, the object stage comprises a base and a support device fixed on the base, wherein the support device comprises a plurality of detachable support sub-devices; and the support device is configured to allow a printed circuit board (PCB) with at least one protruding structure to be placed thereon, and no support sub-device is disposed at a position on the support device corresponding to the protruding structure, wherein the base is provided with an electromagnetic coil on its external surface, wherein the electromagnetic coil is configured to provide the base and the support sub-device with opposite magnetic properties when powered on, so that the base and the support sub-devices are attracted with each other, and wherein the electromagnetic coil is further configured to demagnetize both of the base and the support sub-devices when powered off, so that the base and the support sub-devices are no longer attracted with each other.

11. The hot pressing apparatus of claim 10, wherein
the base is provided with location holes while each of the support sub-devices is provided with a location structure cooperated with one of the location holes in a manner of engaging the location structure into the location hole to fix the support sub-devices onto the base; or the base is provided with location structures while each of the support sub-devices is provided with a location hole cooperated with one of the location structures in a manner of engaging the location structure into the location hole to fix the support sub-devices on the base.

12. The hot pressing apparatus of claim 10, wherein the base is provided with first vacuum holes, the support sub-devices are provided with second vacuum holes, and the first vacuum holes are disposed opposite to the second vacuum holes respectively; and the first vacuum holes and the second vacuum holes form vacuum air paths which are configured to absorb the PCB under a vacuum state.

13. The hot pressing apparatus of claim 11, wherein the base is provided with first vacuum holes, the support sub-devices are provided with second vacuum holes, and the first vacuum holes are disposed opposite to the second vacuum holes respectively; and the first vacuum holes and the second vacuum holes form vacuum air paths which are configured to absorb the PCB under a vacuum state.

14. The object stage of claim 2, wherein the base is provided with first vacuum holes, the support sub-devices are provided with second vacuum holes, and the first vacuum holes are disposed opposite to the second vacuum holes respectively; and the first vacuum holes and the second vacuum holes form vacuum air paths which are configured to absorb the PCB under a vacuum state.

15. The hot pressing apparatus of claim 11, wherein the location structure is clipped into the location hole.

* * * * *